US012404869B1

(12) United States Patent
Chen et al.

(10) Patent No.: US 12,404,869 B1
(45) Date of Patent: Sep. 2, 2025

(54) CENTRIFUGAL HEAT DISSIPATION FAN

(71) Applicant: Acer Incorporated, New Taipei (TW)

(72) Inventors: Tsung-Ting Chen, New Taipei (TW);
Mao-Neng Liao, New Taipei (TW);
Cheng-Wen Hsieh, New Taipei (TW);
Wei-Chin Chen, New Taipei (TW);
Kuang-Hua Lin, New Taipei (TW);
Yu-Ming Lin, New Taipei (TW);
Kuan-Lin Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 19/064,699

(22) Filed: Feb. 27, 2025

(30) Foreign Application Priority Data

Mar. 1, 2024 (TW) .................................. 113107571

(51) Int. Cl.
*F04D 29/30* (2006.01)
*F04D 29/28* (2006.01)
*H05K 7/20* (2006.01)

(52) U.S. Cl.
CPC ........... *F04D 29/281* (2013.01); *F04D 29/30* (2013.01); *H05K 7/20172* (2013.01)

(58) Field of Classification Search
CPC .............................. F04D 29/281; F04D 29/30
See application file for complete search history.

(56) References Cited

U.S. PATENT DOCUMENTS

| 10,247,196 | B2 * | 4/2019 | Lin | F04D 17/16 |
| 10,519,969 | B2 * | 12/2019 | Lin | F04D 29/281 |
| 10,808,715 | B2 * | 10/2020 | Yu | G06F 1/203 |
| 11,441,433 | B2 * | 9/2022 | Yeh | F04D 29/325 |
| 11,530,707 | B2 * | 12/2022 | Lin | B29C 45/0003 |
| 11,629,725 | B2 * | 4/2023 | Chen | F04D 29/162 |
|  |  |  |  | 415/206 |
| 11,946,483 | B2 * | 4/2024 | Ke | F04D 25/0613 |

FOREIGN PATENT DOCUMENTS

| CN | 113048096 A | * | 6/2021 | ............. F04D 29/30 |
| TW | I512200 |  | 12/2015 |  |
| TW | I622706 |  | 5/2018 |  |
| TW | I745927 |  | 11/2021 |  |

* cited by examiner

*Primary Examiner* — Justin D Seabe
(74) *Attorney, Agent, or Firm* — JCIPRNET

(57) ABSTRACT

A centrifugal heat dissipation fan including a housing and a blade wheel disposed in the housing is provided. The housing has two inlets on a rotation axial direction of the blade wheel and at least one outlet on a rotation radial direction of the blade wheel. The blade wheel has a hub and a plurality of metal blades disposed and surrounding to the hub. Each of the metal blades has a body, an upper bending plate and a lower bending plate, wherein the upper bending plate and the lower bending plate are movable relative to the body. An including angle of the upper bending plate relative to the body, and an including angle of the lower bending plate relative to the body are changeable along with the rotating speed of the blade wheel.

12 Claims, 7 Drawing Sheets a # CENTRIFUGAL HEAT DISSIPATION FAN

CROSS-REFERENCE TO RELATED APPLICATION

This application claims the priority benefit of Taiwan application serial no. 113107571, filed on Mar. 1, 2024. The entirety of each of the above-mentioned patent applications is hereby incorporated by reference herein and made a part of this specification.

BACKGROUND

Technical Field

The disclosure relates to a centrifugal heat dissipation fan.

Description of Related Art

With the development of technology, portable electronic devices, such as laptops and smartphones, have been frequently used in daily life. At the same time, in order to meet people's demand for small size and high performance, in addition to improving the above-mentioned goals of electronic devices, how to deal with the heat energy generated during the operation of electronic devices is a major issue in improving the operating performance of electronic devices. Therefore, electronic devices are usually equipped with a heat dissipation module or heat dissipation element, such as a cooling fan, to help dissipate the heat generated during operation of the electronic device to the outside of the electronic device.

The principle of the centrifugal heat dissipation fan is to rotate the blades to generate a pressure difference, so that the air from the external environment enters the fan cavity along the axial direction. Then, it is driven by the rotation of the blades and is discharged from the fan cavity along the radial direction. Generally, the cross-sectional height of blades along the rotation axial direction is positively related to the air inlet volume of the fan. That is to say, the larger the size of the blades along the rotation axial direction, the more inlet air flow is expected.

However, due to manufacturing and assembly tolerances, the upper and lower edges of the blades along the rotation axial direction still need to maintain a certain distance from the inner wall of the fan housing to avoid the blades from hitting the inner wall due to deflection when rotating. Especially when the rotating speed of the blades is low, the energy generated by the electromagnet driving the blades is low at this time, so the blades are in an unstable state, and the above-mentioned deflection is prone to occur.

Based on the above, how to overcome the deflection situation and increase the air inlet volume of the blades is actually a topic that relevant technical personnel need to think about and solve.

SUMMARY

The present disclosure provides a centrifugal heat dissipation fan, which uses movable bending plates of metal blades to change the height of the metal blades along the rotation axial direction with the rotating speed.

The present invention provides a centrifugal heat dissipation fan including a housing and a blade wheel. The housing has a pair of inlets and at least one outlet. The blade wheel is rotatably disposed in the housing. The inlets are located on a rotation axial direction of the blade wheel, the outlet is located on a rotation radial direction of the blade wheel. The blade wheel has a hub and a plurality of metal blades disposed and surrounding to the hub. Each of the metal blades has a body, an upper bending plate and a lower bending plate extending from opposite sides of the body, and the upper bending plate and the lower bending plate respectively correspond to the corresponding inlets. The upper bending plate and the lower bending plate are movable relative to the body, and an including angle of the upper bending plate relative to the body and an including angle of the lower bending plate relative to the body are changed along with a rotating speed of the blade wheel respectively.

Based on the above, the centrifugal heat dissipation fan forms a body on its metal blades and an upper bending plate and a lower bending plate extending from the body. And the upper bending plate corresponds to one of the inlets in the rotation axial direction, and the lower bending plate corresponds to the other inlet in the rotation axial direction. More importantly, the upper bending plate and the lower bending plate are respectively in a movable and flexible state relative to the body, so that the including angle of the upper bending plate relative to the body and the including angle of the lower bending plate relative to the body can be changed with the rotating speed of the blade wheel.

In this way, by appropriately adjusting the deformation capabilities of the upper bending plate and the lower bending plate of the metal blades, the upper bending plate and the lower bending plate will be opened relative to the body due to the increased wind force when the blade wheel is at high speed, thereby improving the ability of the metal blades to capture air volume. At the same time, the electromagnet driving the blade wheel also generates a large amount of energy due to high rotating speed requirements, thereby reducing the possibility of the blade wheel deflecting. Therefore, the aforementioned opening of the upper bending plate and the lower bending plate can be performed smoothly. On the contrary, when the blade wheel is at a low rotating speed, the upper bending plate and the lower bending plate return to their initial states of being folded relative to the body. In this way, the blade wheel deflection problem caused by the low electromagnet energy can be avoided.

DESCRIPTION OF THE EMBODIMENTS

Figure 1:
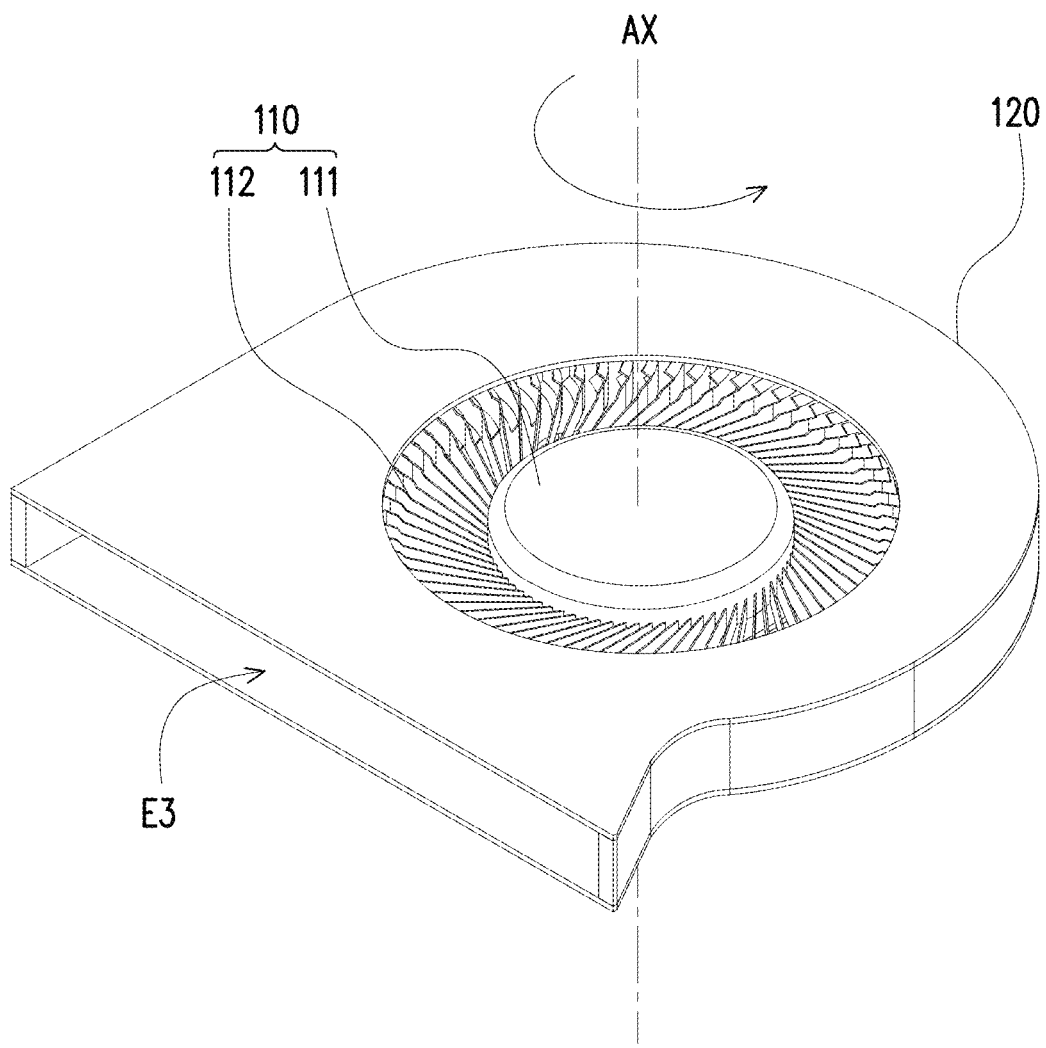
FIG. 1 is a schematic diagram of a centrifugal heat dissipation fan according to an embodiment of the present invention.
Figure 2:
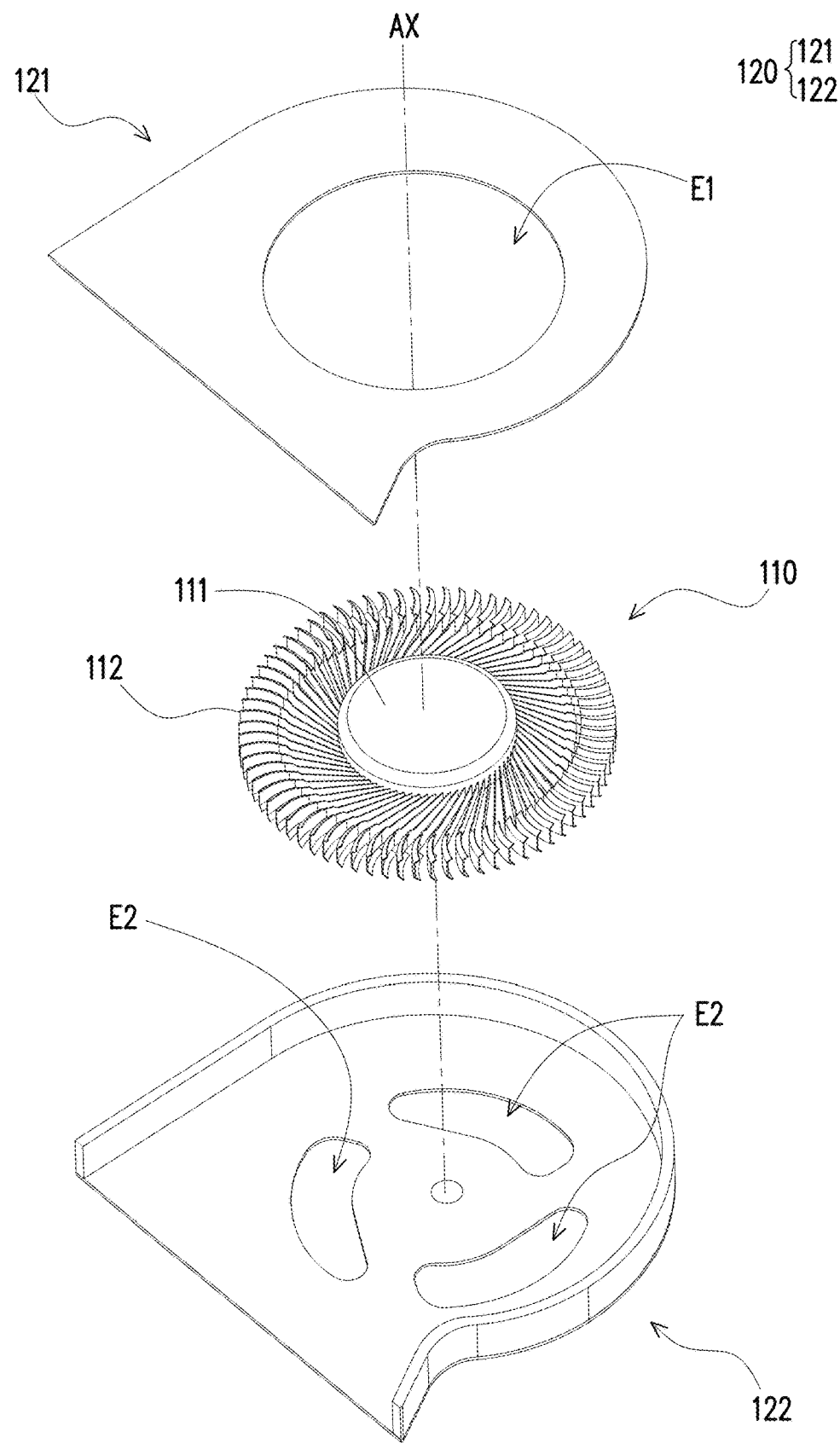
FIG. 2 is an exploded view of the centrifugal heat dissipation fan of FIG. 1.
Figure 3:
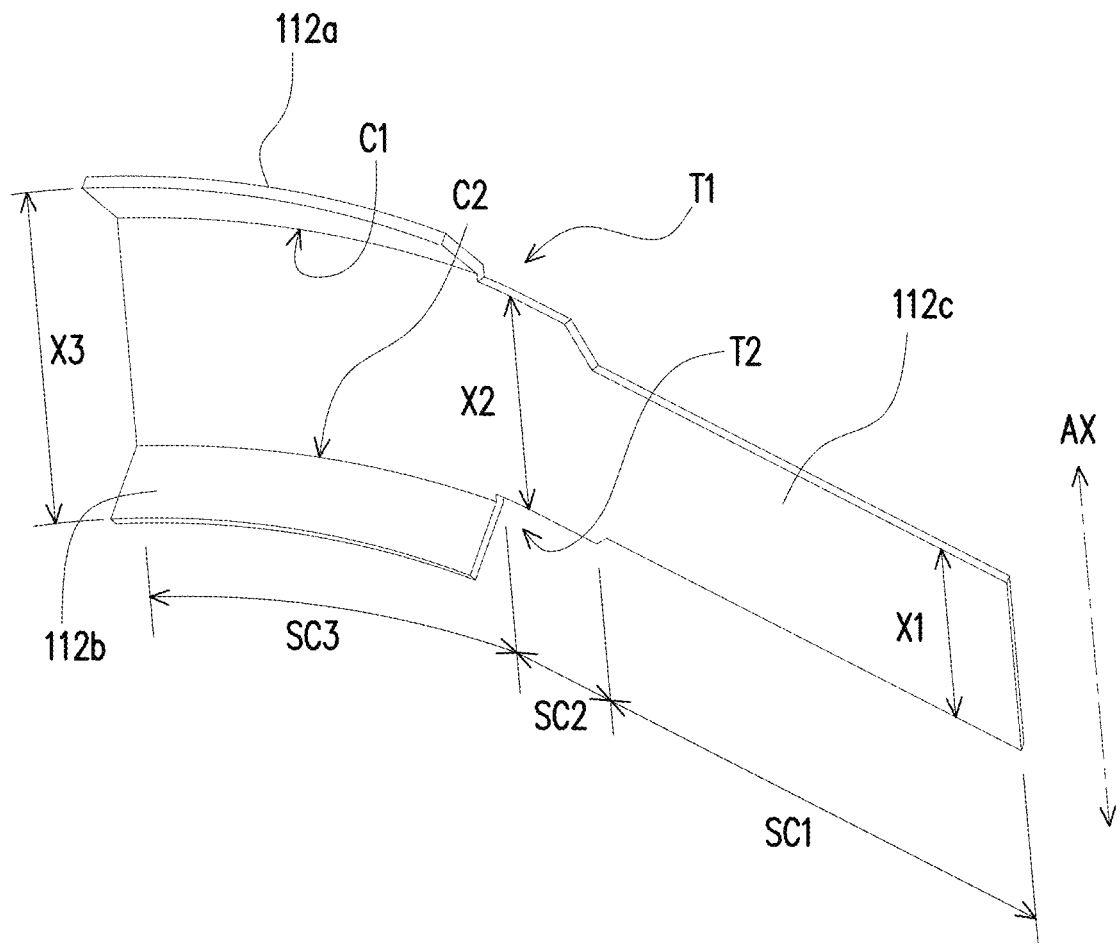
FIG. 3 is a schematic diagram of metal blades of the centrifugal heat dissipation fan.

FIG. 1 is a schematic diagram of a centrifugal heat dissipation fan according to an embodiment of the present invention. FIG. 2 is an exploded view of the centrifugal heat dissipation fan of FIG. 1. FIG. 3 is a schematic diagram of metal blades of the centrifugal heat dissipation fan. Referring to FIG. 1 to FIG. 3 at the same time, in the embodiment, the centrifugal heat dissipation fan 100 is used in portable electronic devices such as notebook computers or tablet computers, and includes a housing 120 and a blade wheel 110. The housing 120 has a pair of inlets E1, E2 and at least one outlet (the embodiment takes an outlet E3 as an example). The blade wheel 110 is rotatably disposed in the housing 120, which usually uses a drive motor as a driving force source. And the magnetic force generated by the electromagnet installed in the stator of the motor becomes the power source of the rotor equipped with the magnet. The motor is, for example, a three-phase motor.

The housing 120 includes a base 122 and a cover plate 121, wherein the base 122 has the inlet E2 and the cover plate 121 has the inlet E1. And the base 122 and the cover plate 121 are combined to form the outlet E3 and accommodate the blade wheel 110 therein.

The inlets E1, E2 are located on a rotation axial direction AX of the blade wheel 110, the outlet E3 is located on a rotation radial direction AD of the blade wheel 110. The blade wheel 110 has a hub 111 and a plurality of metal blades 112 disposed and surrounding to the hub 111. Each of the metal blades 112 has a body 112c, an upper bending plate 112a and a lower bending plate 112b extending from opposite sides of the body 112c. The upper bending plate 112a and the lower bending plate 112b respectively correspond to the corresponding inlets E1, E2. The upper bending plate 112a and the lower bending plate 112b are respectively in a movable and flexible state relative to the body 112c. The upper bending plate 112a and the lower bending plate 112b respectively change the including angle with the body 112c according to a rotating speed of the blade wheel 110.

Figure 4:
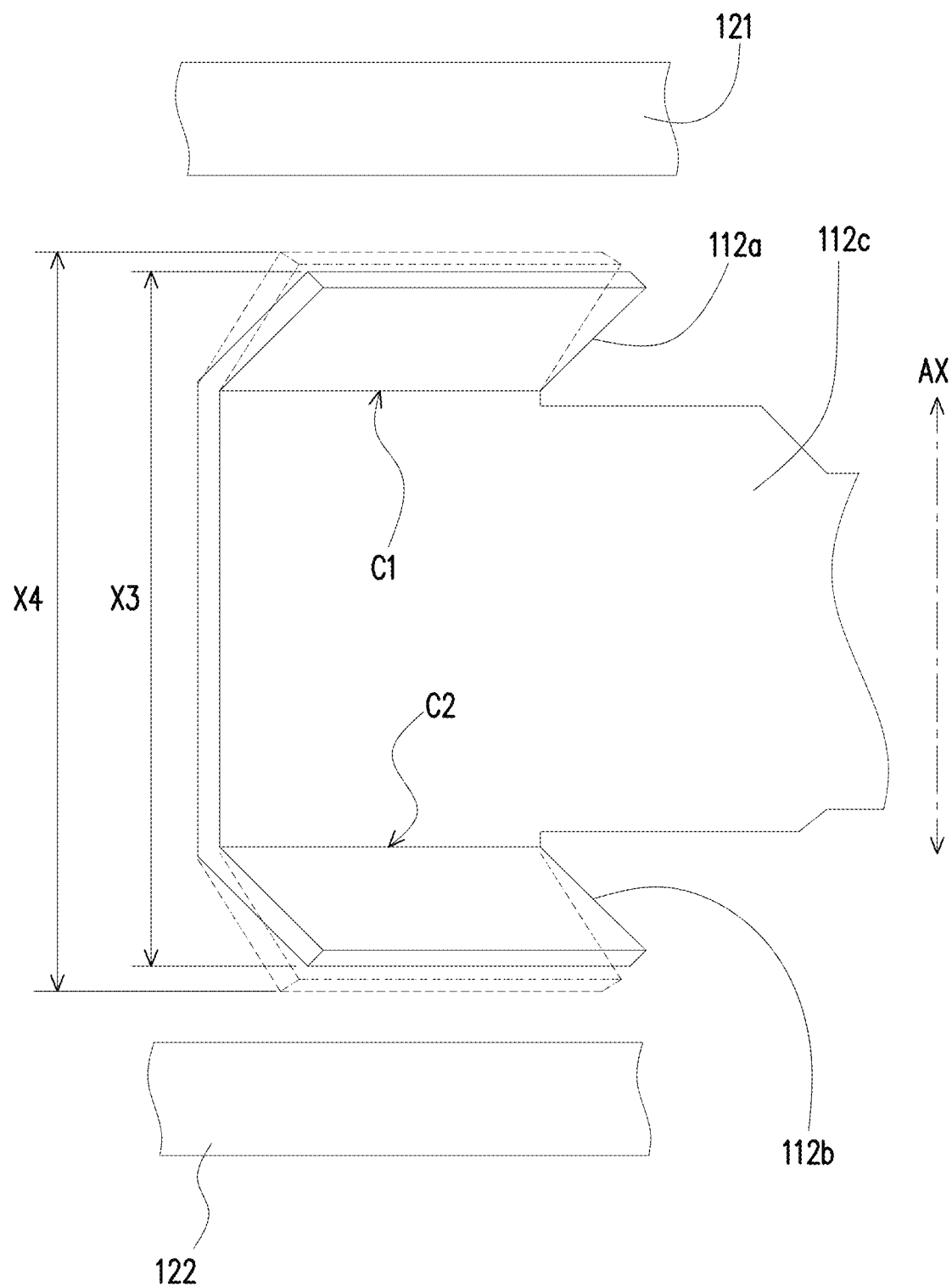
FIG. 4 is a partial schematic diagram of the metal blades of FIG. 3 in different states.

FIG. 4 is a partial schematic diagram of the metal blades of FIG. 3 in different states. Referring to FIG. 3 and FIG. 4 at the same time, in the embodiment, the upper bending plate 112a and the lower bending plate 112b face the same side of the metal blades 112, which is also equivalent to the upper bending plate 112a and the lower bending plate 112b being inclined towards the rotation direction of the blade wheel 110. Here, the rotation direction of the blade wheel 110 is as shown in FIG. 1. Since the thickness of the metal blades 112 in the embodiment is 0.1 mm, it has a certain degree of flexibility. Furthermore, as shown in FIG. 3, the upper bending plate 112a and the lower bending plate 112b of the metal blades 112 are separated from the body 112c only by creases C1 and C2 respectively. Since neither the upper bending plate 112a nor the lower bending plate 112b is connected to the surrounding structure along a rotation radial direction AD, the upper bending plate 112a and the lower bending plate 112b are further provided with mobility to swing relative to the body 112c.

In this way, as shown in FIG. 4, the upper bending plate 112a and the lower bending plate 112b use solid line outlines to represent their undeformed initial states, and use dotted line outlines to represent their deformed states due to the blade wheel 110 reaching a high rotating speed. In other words, when the rotational speed increases and they are deformed to the dotted line outline, the including angles between the upper bending plate 112a and the lower bending plate 112b and the body 112c respectively increase. At the same time, it is also reflected in the size of the metal blades 112 along the rotation axial direction AX. The metal blades 112 have a length X3 along the rotation axial direction AX before deformation, and the metal blades 112 have a length X4 along the rotation axial direction AX after deformation, and X4>X3.

Furthermore, as shown in FIG. 2, the inlets E1, E2 are limited by the structural configuration of the housing 120, so the area of the inlet E1 may be larger than the area of the inlet E2. Accordingly, the embodiment is shown in FIG. 4. There is a minimum gap d1 between the upper edge of the upper bending plate 112a and the inner top surface of the housing 120 (that is, the cover plate 121), and there is a minimum gap d2 between the lower edge of the lower bending plate 112b and the inner bottom surface of the housing 120 (that is, the base 122), and d1>d2. In this way, the upper bending plate 112a and the lower bending plate 112b can produce different deformation effects in response to the different air inlet volume of the inlets E1, E2. In other words, when the blade wheel 110 rotates at high speed, the deformation of the upper bending plate 112a (or the including angle change of the upper bending plate 112a relative to the body 112c) is greater than the deformation of the lower bending plate 112b (or the including angle change of the lower bending plate 112b relative to the body 112c). Besides, in response to the above-mentioned difference in air inlet volume, the size of the upper bending plate 112a along the rotation axial direction AX is larger than the size of the lower bending plate 112b along the rotation axial direction AX.

Figure 5:
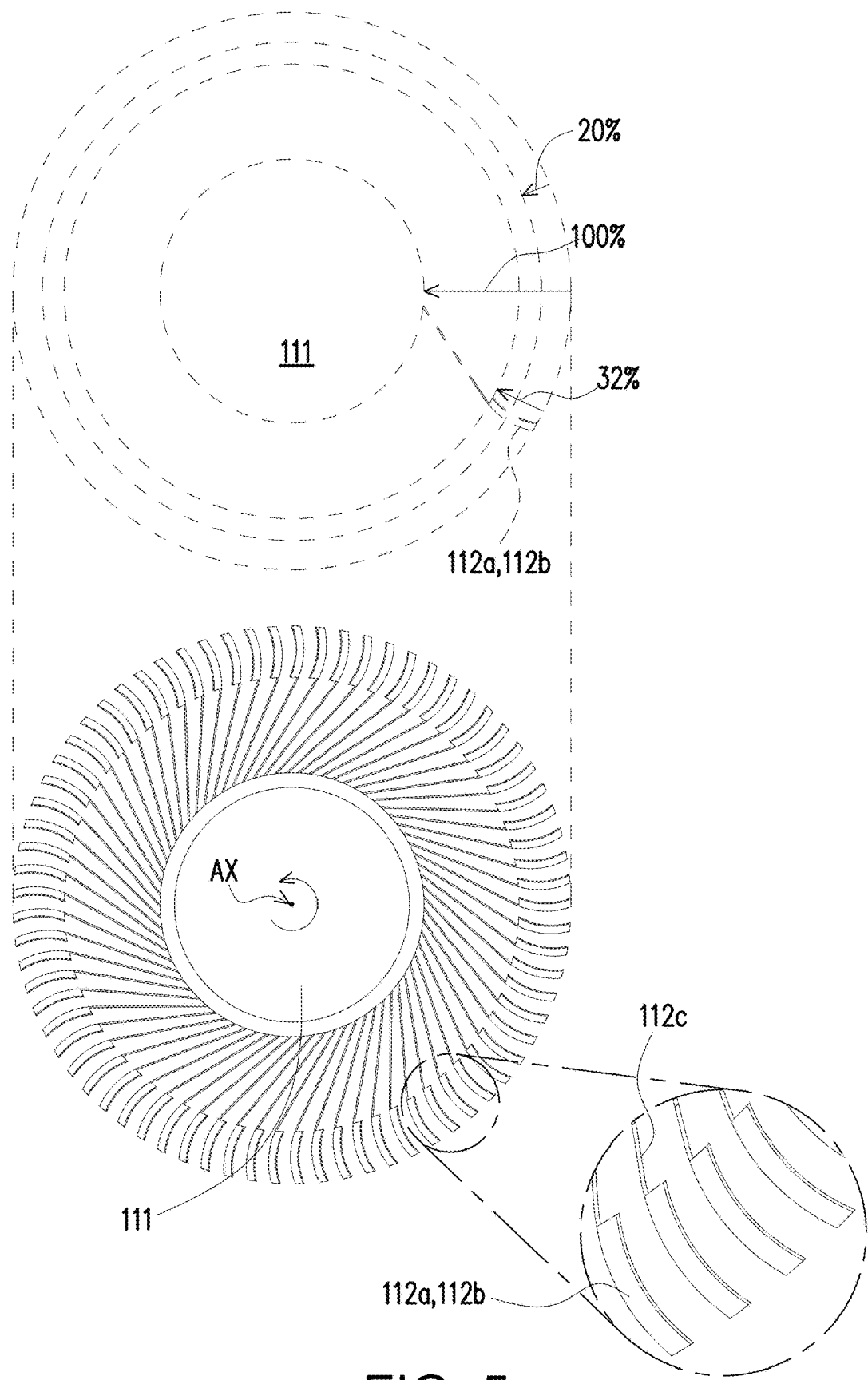
FIG. 5 is a top view of the blade wheel of the centrifugal heat dissipation fan of FIG. 2.

FIG. 5 is a top view of the blade wheel of the centrifugal heat dissipation fan of FIG. 2. Referring to FIG. 5, in order to achieve better air inlet efficiency and reduce the noise generated by the metal blades 112, the optimal size of the upper bending plate 112a or the lower bending plate 112b in the rotation radial direction AD of the embodiment is 20% to 100% of the size of the metal blades 112 along the rotation radial direction AD, wherein 0% is located at the end of each metal blades 112 away from the hub 111. In the embodiment, the size of the upper bending plate 112a and the lower bending plate 112b along the rotation radial direction AD is 32% of the size of the metal blades 112 along the rotation radial direction AD.

Figure 6:
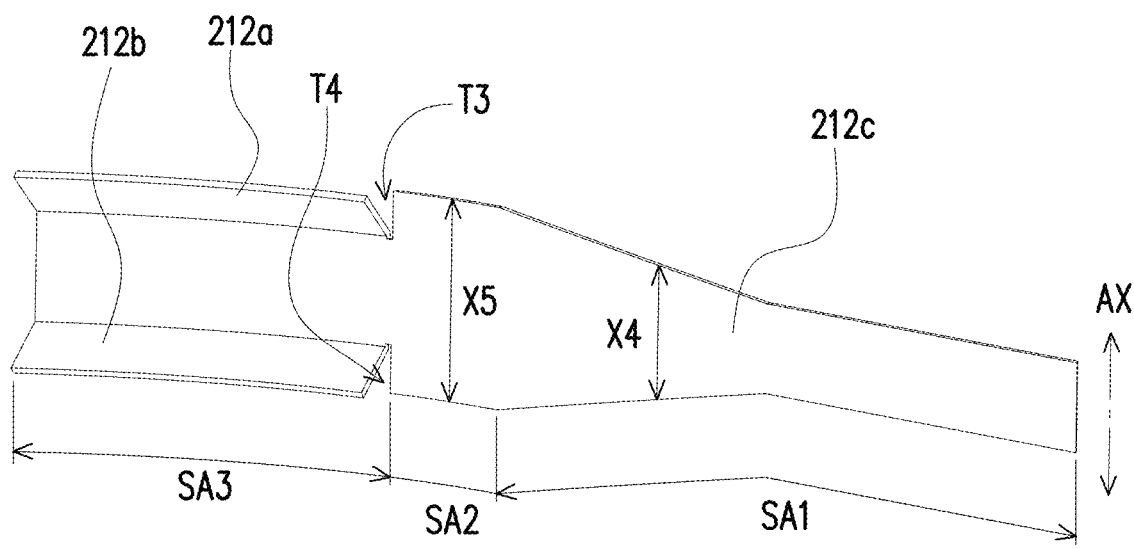
FIG. 6 is a schematic diagram of metal blades according to another embodiment of the present invention.

FIG. 6 is a schematic diagram of metal blades according to another embodiment of the present invention. Referring to FIG. 3 and FIG. 6 at the same time, first, the metal blades 112 includes a section one SC1, a section two SC2 and a section three SC3 in FIG. 3. The section one SC1 is connected to the hub 111 (marked in FIG. 2). The section two SC2 is connected between the section one SC1 and the section three SC3. The upper bending plate 112a and the lower bending plate 112b are located in section three SC3. The size X1 of the section one SC1 along the rotation axial direction AX is smaller than the size X2 of the section two SC2 along the rotation axial direction AX. And the size X2 of the section two SC2 along the rotation axial direction AX is smaller than the size X3 of the section three SC3 along the rotation axial direction AX, as shown in FIG. 3. The metal blades 112 have gaps T1, T2 between the section two SC2 and the section three SC3, thus forming a step along the rotation axial direction AX. This is also one of the reasons why the upper bending plate 112a and the lower bending plate 112b can swing relative to the body 112c.

Then, referring to FIG. 6, in the metal blades 212 of the embodiment, which includes a section one SA1, a section two SA2 and a section three SA3. The section one SA1 is connected to the hub 111. The section two SA2 is connected between the section one SA1 and the section three SA3. The upper bending plate 212a and the lower bending plate 212b are located in the section three SA3. The size X4 of the section one SA1 along the rotation axial direction AX is smaller than the size X5 of the section two SA2 along the rotation axial direction AX. And the size X5 of the section two SA2 along the rotation axial direction AX is equal to the size X5 of the section three SA3 along the rotation axial direction AX.

In other words, the metal blades 212 of the embodiment have shear interleaving T3, T4 between the section two SA2 and the section three SA3 (the upper bending plate 212a and the lower bending plate 212b each intersect the section two SA2 along the rotation direction of the blade wheel) and have no step along the rotation axial direction AX. That is, if the section two SA2 is extended out of the virtual blade surface along the extension direction of the metal blades 212, the orthographic projections of the upper bending plate 212a and the lower bending plate 212b on the virtual blade surface may just overlap on the virtual blade surface.

The following table provides the experimentally obtained deformations of the metal blades 112, 212 of the above two different embodiments, in which the embodiment one is the embodiment shown in FIG. 2, and the embodiment two is the embodiment shown in FIG. 6.

| | Embodiment one (Blade wheel diameter 38 mm) | | | Embodiment two (Blade wheel diameter 62 mm) | | |
|---|---|---|---|---|---|---|
| Blade size (mm) | Low speed | Max. speed | % | Low speed | Max. speed | % |
| The size of the metal blades along the rotation axial direction (mm) | 3.1 | 3.3 | 6.5% | 2.7 | 3.1 | 14.8% |

As can be seen from the above, although the area and deformation of the metal blades 112 of the embodiment one are small, the manufacturing difficulty can be reduced due to the existence of gaps T1 and T2. For the embodiment two, since the metal blades 212 have a larger blade surface (and deformation), they can effectively maintain the blade surface and produce better air inlet effect (increase air inlet volume).

Figure 7:
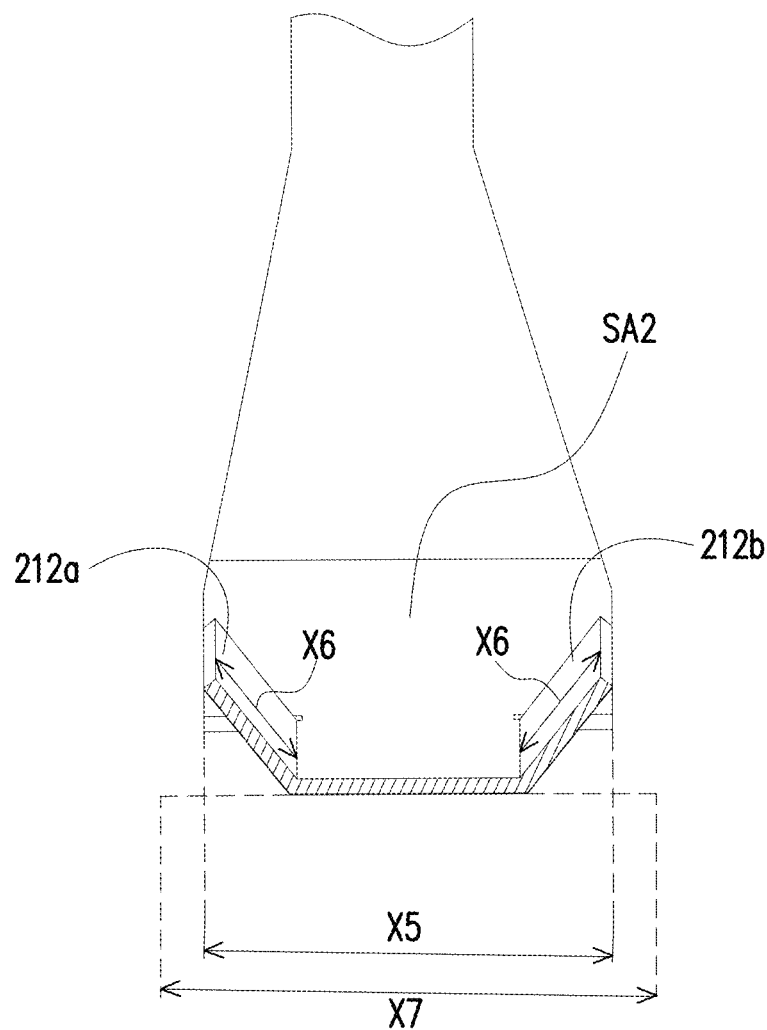
FIG. 7 is a partial cross-sectional view of FIG. 6.

FIG. 7 is a partial cross-sectional view of FIG. 6. Referring to FIG. 7 and FIG. 6, in the embodiment, the designer can increase the size X6 of the upper bending plate 212a and the lower bending plate 212b of the metal blades 212 as much as possible according to the internal space of the housing 120 (such as the distance between the cover plate 121 and the base 122). Herein, when the blade wheel 110 is in a stationary state that has not yet rotated, the upper bending plate 212a and the lower bending plate 212b of the embodiment conform to the aforementioned size X5 along the rotation axial direction AX, as shown in FIG. 7. When the upper bending plate 212a and the lower bending plate 212b are in a completely flat state relative to the section three SA3 of the metal blades 212, there is a size X7. However, due to the operating limitations of the motor, the metal blades 212 cannot technically be completely flattened. Even with sufficient rotational force, the blade structure will be restricted due to creases. In this way, the designer only needs to make the size X7 meet the internal space requirements (such as to avoid interference with the cover plate 121 or the base 122) of the housing 120, and then the designer can smoothly design the required sizes of the upper bending plate 212a and the lower bending plate 212b to be larger than the size X5 and smaller than the size X7.

In summary, in the above-mentioned embodiments of the present invention, the centrifugal heat dissipation fan forms a body on its metal blades and an upper bending plate and a lower bending plate extending from the body. And the upper bending plate corresponds to one of the inlets in the rotation axial direction, and the lower bending plate corresponds to the other inlet in the rotation axial direction. More importantly, the upper bending plate and the lower bending plate are respectively in a movable and flexible state relative to the body, so that the including angle of the upper bending plate relative to the body and the including angle of the lower bending plate relative to the body can be changed with the rotating speed of the blade wheel.

In this way, by appropriately adjusting the deformation capabilities of the upper bending plate and the lower bending plate of the metal blades, the upper bending plate and the lower bending plate will be opened relative to the body due to the increased wind force when the blade wheel is at high speed, thereby improving the ability of the metal blades to capture air volume. At the same time, the electromagnet driving the blade wheel also generates a large amount of energy due to high rotating speed requirements, thereby reducing the possibility of the blade wheel deflecting. Therefore, the aforementioned opening of the upper bending plate and the lower bending plate can be performed smoothly. On the contrary, when the blade wheel is at a low rotating speed, the upper bending plate and the lower bending plate return to their initial states of being folded relative to the body. In this way, the blade wheel deflection problem caused by the low electromagnet energy can be avoided.

What is claimed is:

1. A centrifugal heat dissipation fan, comprising:
a housing, having a pair of inlets and at least one outlet; and
a blade wheel, rotatably disposed in the housing, the inlets are located on a rotation axial direction of the blade wheel, the at least one outlet is located on a rotation radial direction of the blade wheel, the blade wheel has a hub and a plurality of metal blades disposed and surrounding to the hub, each of the metal blades has a body, an upper bending plate and a lower bending plate extending from opposite sides of the body, the upper bending plate and the lower bending plate respectively correspond to the corresponding inlets, and the upper bending plate and the lower bending plate are movable relative to the body, an including angle of the upper bending plate relative to the body and an including angle of the lower bending plate relative to the body are changed along with a rotating speed of the blade wheel respectively.

2. The centrifugal heat dissipation fan according to claim 1, wherein the upper bending plate and the lower bending plate face the same side of the metal blades.

3. The centrifugal heat dissipation fan according to claim 1, wherein the upper bending plate and the lower bending plate face a rotation direction of the blade wheel.

4. The centrifugal heat dissipation fan according to claim 1, wherein the including angles between the upper bending plate and the lower bending plate and the body respectively increase as the rotating speed increases.

5. The centrifugal heat dissipation fan according to claim 1, wherein the upper edge of the upper bending plate has a minimum gap d1 relative to the inner top surface of the housing, and the lower edge of the lower bending plate has a minimum gap d2 relative to the inner bottom surface of the housing, and d1>d2.

6. The centrifugal heat dissipation fan according to claim 5, wherein the inlet area corresponding to the upper bending plate is larger than the inlet area corresponding to the lower bending plate.

7. The centrifugal heat dissipation fan according to claim 1, wherein the radial dimensions of the upper bending plate and the lower bending plate account for 20% to 100% of the radial dimensions of each blade, wherein 0% is located at the end of each metal blades away from the hub.

8. The centrifugal heat dissipation fan according to claim 1, wherein the thickness of each metal blades is 0.1 mm.

9. The centrifugal heat dissipation fan according to claim 1, wherein the metal blades include a section one, a section two and a section three, the section one is connected to the hub, the section two is connected between the section one and the section three, the upper bending plate and the lower bending plate are located in the section three, the size of the section one along the rotation axial direction is smaller than the size of the section two along the rotation axial direction, and the size of the section two along the rotation axial direction is smaller than the size of the section three along the rotation axial direction.

10. The centrifugal heat dissipation fan according to claim 9, wherein the metal blades have gaps between the section two and the section three and steps along the rotation axial direction.

11. The centrifugal heat dissipation fan according to claim 1, wherein the metal blades include a section one, a section two and a section three, the section one is connected to the hub, the section two is connected between the section one and the section three, the upper bending plate and the lower bending plate are located in the section three, the size of the section one along the rotation axial direction is smaller than the size of the section two along the rotation axial direction, and the size of the section two along the rotation axial direction is equal to the size of the section three along the rotation axial direction.

12. The centrifugal heat dissipation fan according to claim 11, wherein the metal blades have shear interleaving between the section two and the section three and have no step along the rotation axial direction.

\* \* \* \* \*